(12) United States Patent
Pelley, III et al.

(10) Patent No.: US 7,564,738 B2
(45) Date of Patent: Jul. 21, 2009

(54) DOUBLE-RATE MEMORY

(75) Inventors: Perry H. Pelley, III, Austin, TX (US);
George P. Hoekstra, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 257 days.

(21) Appl. No.: 11/464,129

(22) Filed: Aug. 11, 2006

(65) Prior Publication Data
US 2008/0037357 A1 Feb. 14, 2008

(51) Int. Cl.
*G11C 8/16* (2006.01)
(52) U.S. Cl. .......................... 365/233.13; 365/230.05; 365/189.04; 365/233.19; 365/233.11
(58) Field of Classification Search ............ 365/230.05, 365/189.04, 233.19, 233.11, 233.13
See application file for complete search history.

(56) References Cited

U.S. PATENT DOCUMENTS

| | | | |
|---|---|---|---|
| 5,555,527 A * | 9/1996 | Kotani et al. ................. | 365/222 |
| 5,781,480 A | 7/1998 | Nogle et al. | |
| 6,044,031 A * | 3/2000 | Iadanza et al. ......... | 365/230.03 |
| 6,078,527 A | 6/2000 | Roth et al. | |
| 6,233,191 B1 * | 5/2001 | Gould et al. ................. | 365/221 |
| 7,178,001 B2 * | 2/2007 | Mes ......................... | 365/233.1 |
| 2006/0262608 A1 * | 11/2006 | Babb et al. ............. | 365/189.01 |

OTHER PUBLICATIONS

Kessler et al "The Alpha 21264 Microprocessor Architecture" Computer Design: VLSI in Computers and Processors, 1998. ICCD '98. Proceedings., International Conference on Oct. 5-7, 1998 pp. 90-95.

* cited by examiner

*Primary Examiner*—Thong Q Le
(74) *Attorney, Agent, or Firm*—James L. Clingan, Jr.; Robert L. King

(57) ABSTRACT

A double-rate memory has an array of single word line memory cells arranged in rows and columns. The single word line memory cells provide and store data via a first port. Addressing and control circuitry is coupled to the array of single word line memory cells. The addressing and control circuitry receives an address enable signal to initiate an access of the array whereby an address is received, decoded, and corresponding data retrieved or stored. Edge detection circuitry receives a memory clock and provides the address enable signal upon each rising edge and each falling edge of the memory clock to perform two memory operations in a single cycle of the memory clock. A memory operation includes addressing the memory and storing data in the memory or retrieving and latching data from the memory. In another form a double-rate dual port memory permits two independent read/write memory accesses in a single memory cycle.

20 Claims, 5 Drawing Sheets

DOUBLE-RATE MEMORY

FIELD OF THE INVENTION

This invention relates to memories, and more particularly, to memory circuits that are operable at double a clock frequency.

BACKGROUND OF THE INVENTION

There are situations that have become more common in which a system clock is operated at a frequency well below the capability of the memory that is part of the system. The memory may even have the ability to operate at twice the frequency of the system clock. This situation can arise, for example, in the case of a cache embedded in the same integrated circuit as a processor. One technique for taking advantage of this ability of a memory is to multiply the system clock and use the multiplied clock for operating the memory. To double the frequency while keeping the clock operating properly, the master clock should not merely be doubled but quadrupled then divided by two. This will typically require an additional phase locked loop (PLL). PLLS are relatively large circuits, and their power consumption is proportional to frequency. Thus, the likely requirement of an additional PLL that operates at four times the master clock frequency requires costly additional space and significant extra power.

Thus, there is a need to reduce or remove the disadvantages of increasing a memory's operating frequency from that of a master clock.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect a memory circuit uses both the rising edge and falling edge of a system clock to double the speed of operation of the memory. This is better understood by reference to the drawings and the following description.

Figure 1:
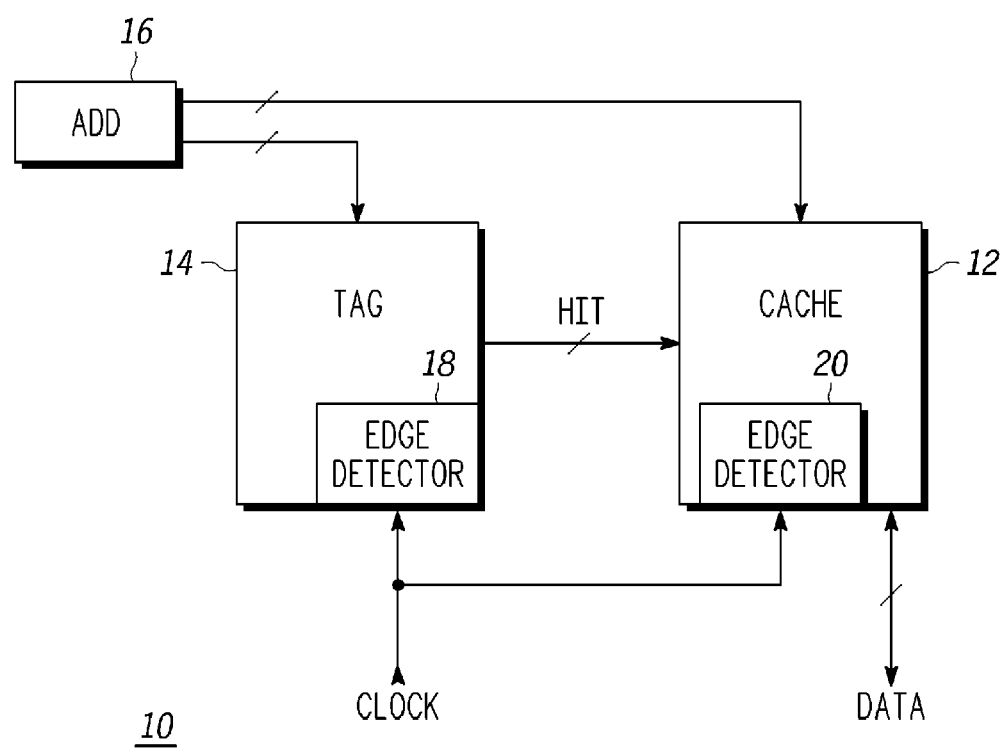
FIG. 1 is a memory circuit according to an embodiment of the invention.

Shown in FIG. 1 is a memory circuit 10 comprising a cache memory 12, a TAG memory 14, and an Address buffer 16. Cache memory 12 includes an edge detector 20 for receiving a clock signal. Similarly TAG memory 14 includes an edge detector 18 for receiving the clock signal. TAG memory 14 compares a portion of the address from address buffer 16 to its stored addresses to determine if there is a hit. Cache memory 12 responds to another part of the address and provides data from or writes data if it receives a hit signal from TAG memory 14. Both TAG memory 14 and cache memory 12 operate at the twice the frequency of the clock signal. Edge detectors 18 and 20 provide information as to whether the edge of the clock is a rising edge or a falling edge. An access is provided on each edge. This has the effect of the doubling the rate of the memory because it operates on both edges, rising and falling, of the clock instead of providing just one access per clock cycle.

Figure 2:
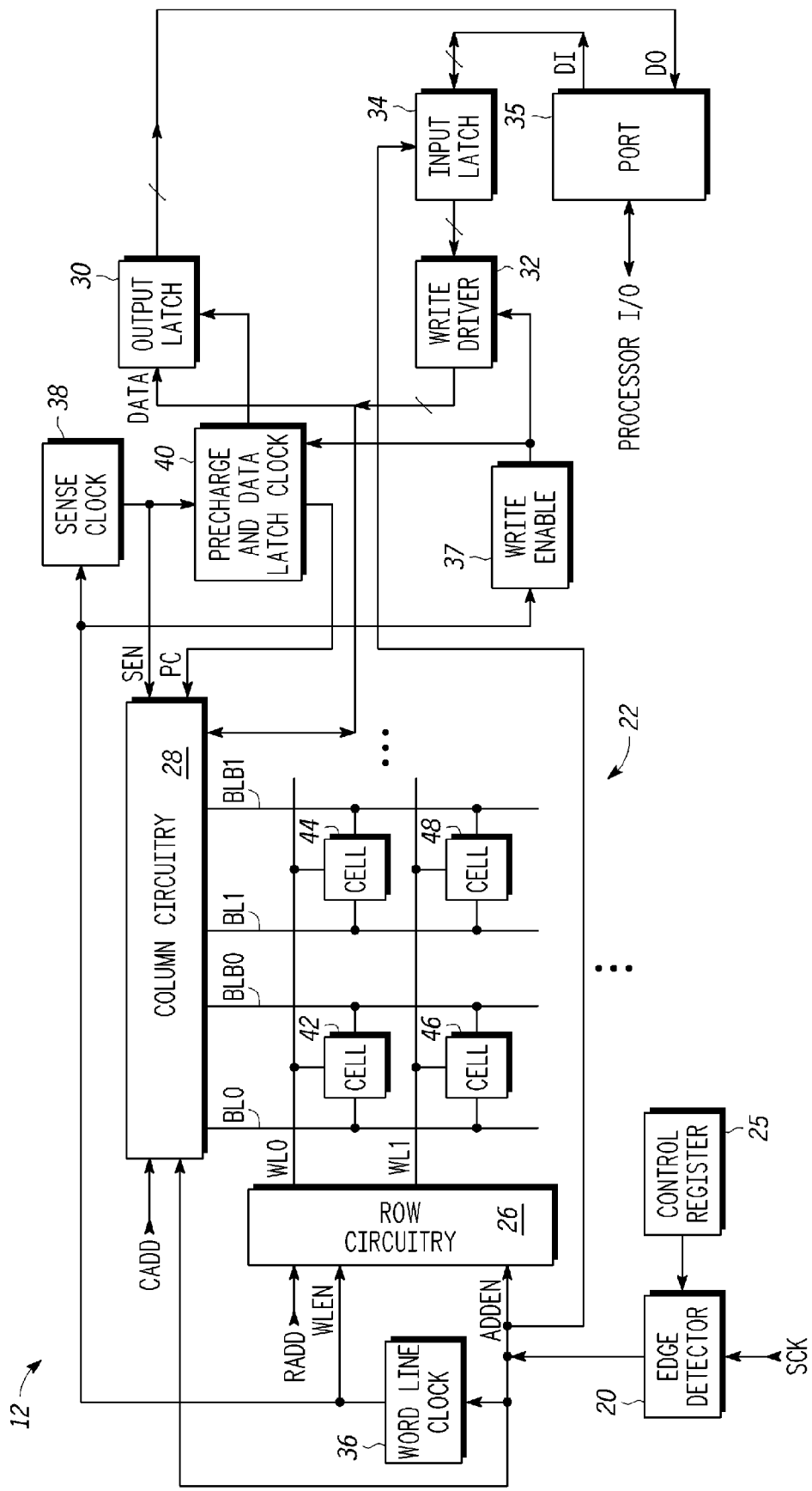
FIG. 2 is a more detailed diagram of a cache memory from the circuit of FIG. 1.

Shown in FIG. 2 is cache memory 12 in more detail. As shown in FIG. 2, cache memory 12 comprises an array 22, edge detector 20 as also shown in FIG. 1, a control register 25 coupled to edge detector 20, row circuitry 26 coupled to array 22, column circuitry 28 coupled to array 22, an output latch 30 coupled to column circuitry 28, a write driver 32 coupled to column circuitry 28, an input latch 34 coupled to write driver 32, a port 35 coupled to output latch 30 and input latch 34, a word line clock circuit 36 coupled to edge detector 20 and row circuitry 26, a write enable circuit 37 coupled to word line clock circuit 36 and write driver 32, a sense clock circuit 38 coupled to word line clock circuit 36 and column circuitry 28, a precharge and data latch clock circuit 40 coupled to sense enable circuit 38 and column circuitry 28 as well as write enable circuit 37, and a port 35 coupled to input latch 34 and output latch 30. Array 22 comprises a memory cell 42 coupled to a word line WL0 and a pair of bit lines BL0 and BLB0, a memory cell 44 coupled to word line WL0 and a pair of bit lines BL1 and BLB1, a memory cell 46 coupled to a word line WL1 and pair of bit lines BL0 and BLB0, and a memory cell 48 coupled to word line WL1 and pair of bit lines BL1 and BLB1. Only four memory cells are shown but many more memory cells not shown are also part of memory 12. In this example, array 22 is made up of SRAM cells, but in other embodiments, the array may comprise memory cells with only one bit line. The memory cells may also be non-volatile memory cells, DRAM cells, or some other type of memory cell.

Figure 3:
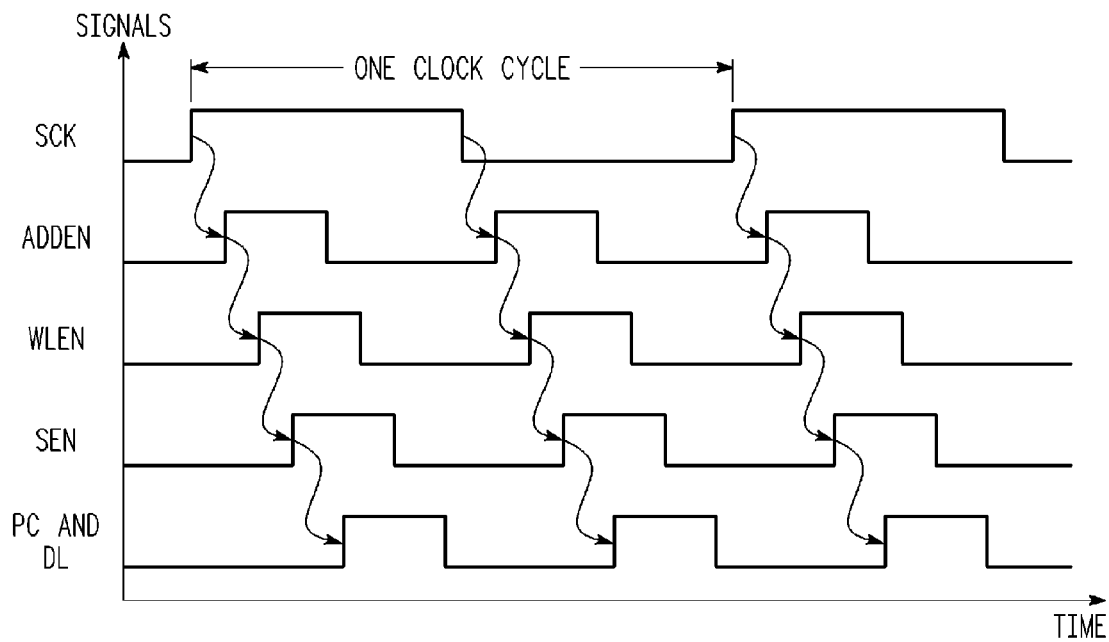
FIG. 3 is a timing diagram of a read operation of the cache memory of FIG. 2.

Shown in FIG. 3 is a timing diagram of the read operation of memory 12. As shown, a rising edge of a system clock SCK causes edge detector 24 to generate an address enable clock ADDEN which causes row circuitry 26 to latch a row address RADD and column circuitry to latch a column address CADD. Column circuitry 28 then couples a pair of bit lines selected by column address CADD to a sense amplifier in column circuitry 28. Word line clock circuit 36 generates a word line enable signal WLEN in response to address clock ADDEN being asserted. Row circuitry 26 enables a word line selected by row address RADD that was latched in response to word line enable signal WLEN being asserted. This causes memory cells along the selected word line to provide their data state to the bit lines to which they are coupled. Sense clock circuit 38 provides a sense enable signal SEN to column circuitry 28 in response to word line enable signal WLEN being asserted. The sense amplifier inside column circuitry senses the logic state of the memory cell that is located at the intersection of the selected word line and selected bit line pair in response to sense enable signal SEN and provides the corresponding signal to output latch 30. Sense clock 38 generates precharge signal PC that precharges array 22 and data latch signal DL that causes output latch 30 to latch the data received from column circuitry 28 and provide an output signal DO to port 35. Port 35 is shown as the port for access to the memory by a processor. In another application, port 35 may not be present.

The reading may continue with a subsequent edge of system clock SCK. This is shown in FIG. 3 with the falling edge of SCK causing the generation of address enable signal ADDEN which causes the latching of the row and column address and consequent bit line pair selection in the same as for the case described for the rising edge of system clock SCK. The rest of the read operation continues the same as well. Address enable clock ADDEN causes the generation of the write enable signal which causes the selected word line to be enabled and causes the assertion of sense enable signal SEN. Sense enable signal SEN causes sensing to occur and the generation of precharge and data latch signal PC/DL which in turn causes the latching of the output signal and its availability at port 35. The reading further continues with the rising edge of system clock CSK in the same manner.

Figure 4:
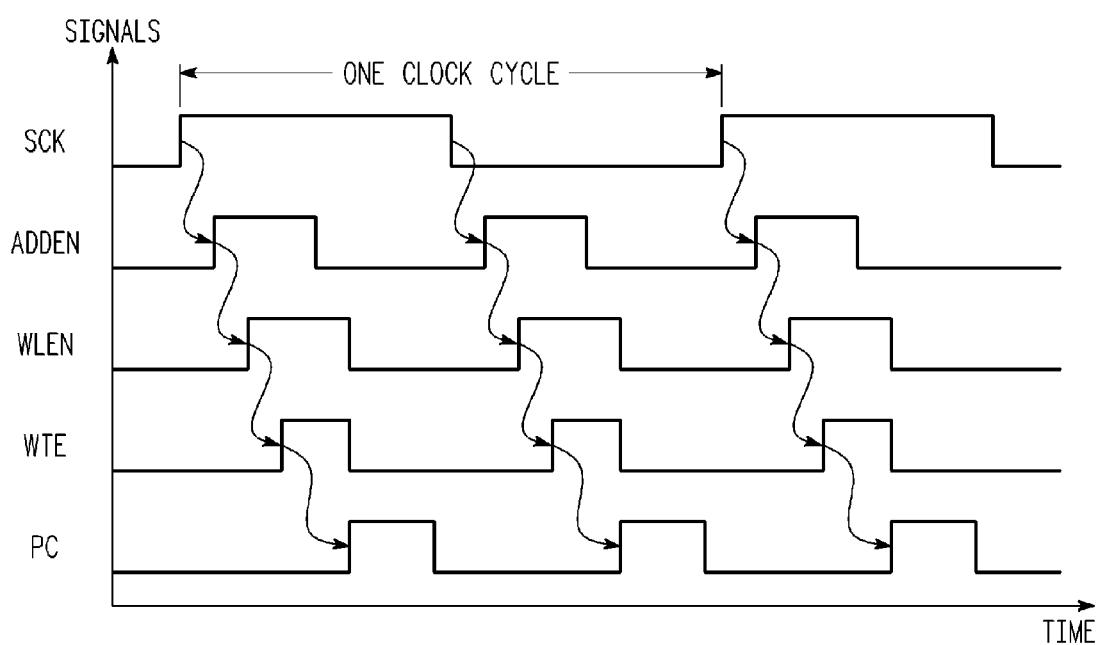
FIG. 4 is a timing diagram of a write operation of the cache memory of FIG. 2.

Writing is very similar. The operation of row circuitry 26 is the same as described for reading. As shown in FIG. 4, a rising edge of system clock SCK causes edge detector 24 to generate address enable signal ADDEN. For writing, port 35 receives data in DI which is coupled to input latch 34 where it is latched in response to address enable signal ADDEN. As for the read operation, word line enable signal WLEN is generated in response to address enable signal ADDEN being asserted. In the write operation, word line enable signal WLEN causes write enable circuit 37 to provide a write enable signal WTE to write driver 32 which responds by providing data to the selected bit lines. Word line enable and write enable signals terminate at substantially the same time. Precharge clock circuit 40, in response to write enable signal WTE, provides precharge signal PC to column circuit 28 to precharge the bit lines. Writing continues with the falling edge of system clock SCK generating another address enable signal. The operation continues as described for the rising edge of system clock SCK. The result is that two writes occur in one cycle. The next rising edge initiates another cycle where another write can continue. Although this approach can be used in a burst, the double rate can continue indefinitely and is not necessarily limited to a burst. Control register 25 is coupled to edge detector 24 for controlling the mode of edge detector 24. In the mode described, address enable signal ADDEN is generated by both the rising and falling edges of system clock SCK. Control register 25 can also select a mode in which only one edge of system clock SCK would generate the address enable signal and thus result in one memory access per cycle of system clock SCK. This has the effect of saving power in memory 12 when lower utilization of the memory is required.

Figure 5:
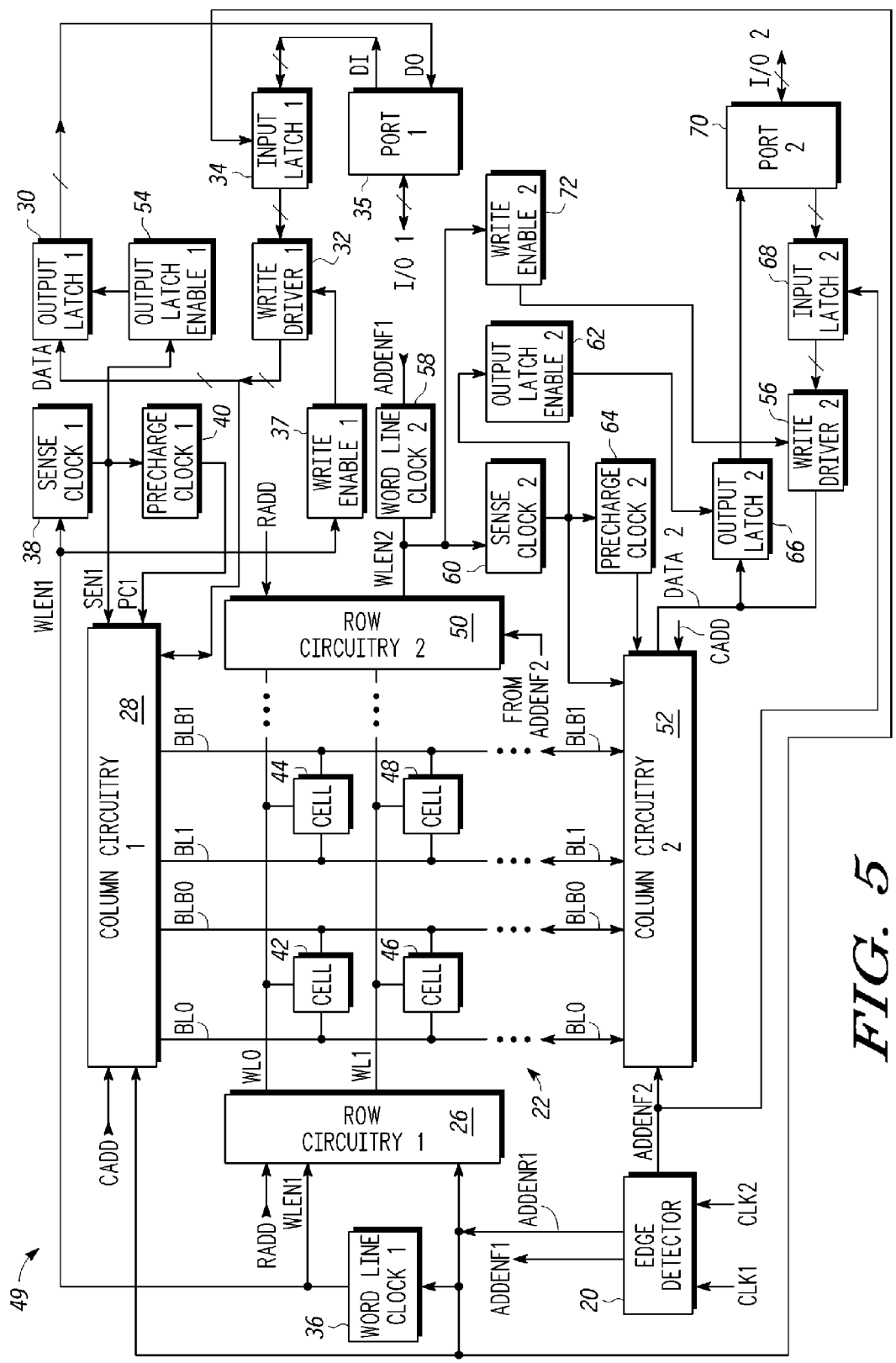
FIG. 5 is a combination block diagram and circuit diagram of an alternative cache memory.

Shown in FIG. 5 is a memory 49 that is a modified version of memory 12 for use as a dual port memory. The elements analogous to those of memory 12 have the same identifying numbers and the new elements have different numbers. Memory 49 comprises array 22, edge detector 20 for receiving system clocks CLK1 and CLK2, row circuitry 26 coupled to array 22, column circuitry 28 coupled to array 22, output latch 30 coupled to column circuitry 28, a write driver 32 coupled to column circuitry 28, input latch 34 coupled to write driver 32, a port 35 coupled to output latch 30 and input latch 34, word line clock1 circuit 36 coupled to edge detector 20 and row circuitry 26, a write enable circuit is coupled to word line clock circuit 36 and write driver 32, a sense enable clock circuit 38 coupled to word line clock circuit 36 and column circuitry 28, precharge and data latch clock circuit 40 coupled to sense enable circuit 38 and column circuitry 28 as well as write enable circuit 37, and port 35 coupled to input latch 34 and output latch 30. Array 22 comprises memory cell 42 coupled to word line WL0 and pair of bit lines BL0 and BLB0, memory cell 44 coupled to word line WL0 and pair of bit lines BL1 and BLB1, memory cell 46 coupled to word line WL1 and pair of bit lines BL0 and BLB0, and memory cell 48 coupled to word line WL1 and pair of bit lines BL1 and BLB1. Memory 49 further comprises row circuitry 50 coupled to edge detector 20 and to word lines WL0 and WL1 on the opposite side of array 22 from row circuitry 26, column circuitry 52 coupled to edge detector 20 and the bit lines (shown as BL0, BLB0, BL1, and BLB1) on the opposite side of array 22 from column circuitry 28, an output latch enable circuit 54 coupled to output latch 30 and word line clock circuit 36, a write driver 56 coupled to column circuitry 52, a word line clock circuit 58 coupled to edge detector 20 and row circuitry 50, a sense clock circuit 60 coupled to column circuit 52 and word line clock circuit 58, an output latch enable circuit 62 coupled word line clock enable circuit 58 and write driver circuit 56, a precharge clock circuit 64 coupled to sense clock circuit 60 and column circuit 52, an output latch 66 coupled to column circuit 52 and output latch enable circuit 62, an input latch 68 coupled to edge detector 20 and write driver circuit 56, and a port 70 coupled to output latch 66 and input latch 68. In this example, both row circuitry 26 and 50 include word line drivers that are tri-statable. In another embodiment column circuit 28 may be interlaced with column circuitry 52 at one end of the bitlines. In yet another embodiment row circuitry 26 may be interlaced with row circuit 50 at one end of the wordlines.

Figure 6:
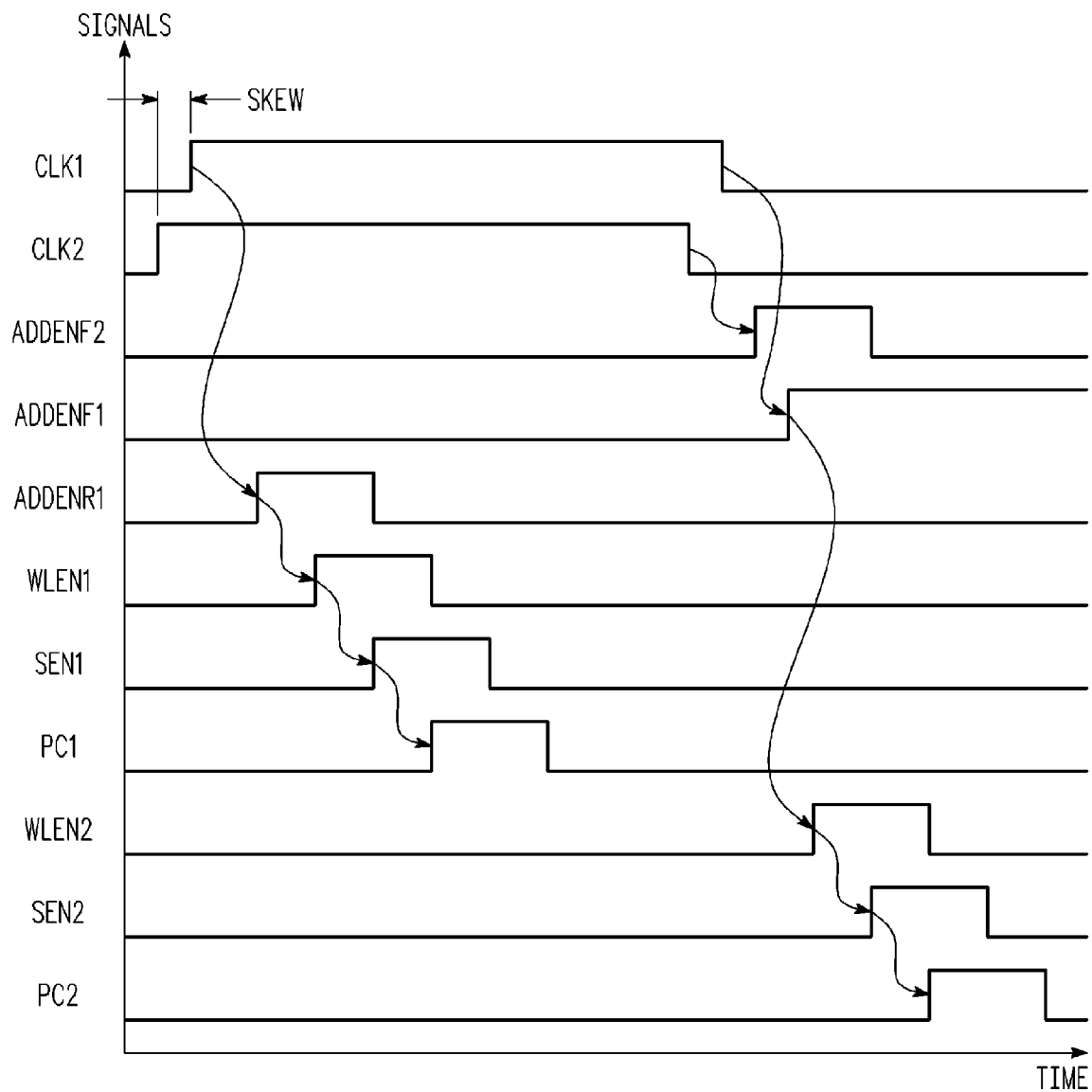
FIG. 6 is a timing diagram of a read operation of the cache memory of FIG. 5.

Shown in FIG. 6 is a timing diagram showing the operation of memory 49 for a read operation. In operation port 35, which can be considered port 1, is based on the rising edge of clock CLK1 and has the same operation as the rising edge operation of memory 12 of FIG. 2. Port 70, which can be considered port 2 is based on the operation of clock CLK 2 and the falling edge of CLK1. In typical dual port operation two different sources with somewhat different clocks are intended to use the memory. The clocks of the two sources will have some skew as shown in FIG. 6. The timing of the relevant address is based on the clock relevant to the particular source. Thus, the address for the source associated with clock CLK 2 is latched relative to the relevant clock edge, which is the falling edge in this example. Thus as shown, the latching of the address is triggered by the falling edge of clock CLK2.

The subsequent operation is based on clock CLK1 to ensure that there is sufficient time to perform all of the necessary operations. In situations where it is known that skew will be negligible, clock CLK2 is not necessary so that clock CLK1 and can replace clock CLK2. Once a memory access is initiated, the access is self-timed to completion.

The operation of memory 49 as shown in FIG. 6 begins with the rising edge of clock CLK1 which causes edge detector to generate address enable signal ADDENR1, which is the address enable signal triggered off the rising edge of clock CLK1 and which causes row circuitry 26 to latch row address RADD and column circuitry 28 to latch column address CADD. This is the same operation as for memory 12 as described for a rising edge of system clock SCK. Operation continues with generation of word line enable signal WLEN1 (same as WLEN in FIG. 3) which causes the selected word line to be enabled. Sense enable signal SEN1 (same as SEN in FIG. 3) is then generated which causes the sensing the state of the selected cells along the selected word line. The sensing results in the output latch latching the data in response to the output latch enable circuit 54 providing the output enable signal. The output enable signal is generated in response to the sense enable signal. After latching the data is provided to port 1 as data out DO.

With regard to the second port, operation begins by latching the row and column addresses in response to the falling edge of clock CLK2. This is shown as address enable signal ADDENF2 being generated by edge detector 20 which causes column circuitry 52 and row circuitry 50 to latch the column address CADD and row address RADD, respectively. After latching the row and column address based on clock CLK2, timing of the operation of the memory continues based on timing from clock CLK1. Address enable signal ADDENF1 is generated in response to the falling edge of clock CLK 1 by edge detector 20 which is received by word line clock circuit 58 which in turn generates word line enable signal WLEN2 which causes row circuitry to enable the word line selected by the latched row address. Word line enable signal WLEN2 is also received by sense clock circuit 60 which responds by generating a sense enable signal received by column circuitry by enabling sense amplifiers which sense the state of the memory cells along the selected word line and on the selected bit line pairs. Data is the received by output latch 66 which is enabled by an output latch enable circuit 62 generated by output latch enable signal 62 in response to sense enable signal. Output latch 66 latches the data and provides it to port 70. Sense enable signal SEN2 also causes precharge clock circuit 64 to generate a precharge signal PC and provide it to column circuitry 52 in preparation for the next memory access.

Thus memory 49 is a dual port memory having two ports, one based on the rising edge of the system clock and another on the falling edge. This can be joined with TAG 14 in a similar manner to memory 12 being joined with TAG memory 14 as shown in FIG. 1. TAG 14 can be divided into two TAGs, one for each port. One of the characteristics of TAGs is that they generally store information as to whether the various locations contain valid data and this information is contained in valid bits that are set to the valid or invalid condition. After a write, then a valid bit may need to be set for that location but an access may be being made for the other port. The tag valid bit can be placed in a separate multi-ported array which will allow the array to be read and written each memory cycle. A separate valid bit array also allows a flash clear where all of the bits are cleared in one cycle. In another embodiment the tags can be split into two tags; one for each port.

Memory cells 42, 44, 46, and 48 are single-word-line memory cells in that they are coupled to only one word line but. Generally dual port memories have required double-word-line memory cells that are coupled to two word lines. In such case the memory array is expanded greatly because the cell requires two additional pass gate transistors in addition to an additional word line for each row of memory cells.

Various other changes and modifications to the embodiments herein chosen for purposes of illustration will readily occur to those skilled in the art. For example, the memory was described as being used as a cache, which is a particularly beneficial use, but it could be used as a general purpose memory or even as a stand alone memory. Also a single memory cell was sometimes described as being selected but more than one could be selected either in the same array as array 22 or in other arrays not shown. To the extent that such modifications and variations do not depart from the spirit of the invention, they are intended to be included within the scope thereof which is assessed only by a fair interpretation of the following claims.

The invention claimed is:

1. A memory comprising:
   an array of single word line memory cells arranged in rows and columns, the single word line memory cells for providing and storing data via a first port;
   addressing and control circuitry coupled to the array of single word line memory cells, the addressing and control circuitry having an input for receiving an address enable signal to determine when an address is received, decoded, and corresponding data retrieved or stored; and
   edge detection circuitry having an input for receiving a memory clock, the edge detection circuitry providing the address enable signal upon each rising edge and each falling edge of the memory clock to perform two memory operations in a single cycle of the memory clock, wherein a memory operation comprises addressing the memory and storing data in the memory or retrieving and latching data from the memory.

2. The memory of claim 1 further comprising:
   a second port for receiving and providing data, wherein
   said addressing and control circuitry further comprises row circuitry at each end of a plurality of word lines within the array of single word line memory cells for selectively addressing each of the plurality of word lines from either end.

3. The memory of claim 2 wherein the edge detection circuitry further comprises a second input for receiving a second memory clock, the memory clock for communicating data via the first port and the second memory clock for communicating data via the second port.

4. The memory of claim 1 wherein the memory is a cache and further comprises:
   a tag array coupled to the cache for providing a match signal indicating that a received address corresponds to an address contained within the cache, said tag array comprising second edge detection circuitry having an input for receiving the memory clock, the second edge detection circuitry providing the match signal upon each rising edge and each falling edge of the memory clock to perform two address compare operations in a single cycle of the memory clock.

5. The memory of claim 1 wherein a first memory operation is completed substantially within a first portion of the memory clock in response to a rising edge of the memory clock and a second memory operation is completed substantially within a subsequent second portion of the memory clock in response to a falling edge of the memory clock, the first portion of the memory clock and the second portion of the memory clock comprising a single cycle, the first memory operation and the second memory operation comprising a memory address decode and memory access to either read and latch data from the memory or to write data to the memory.

6. The memory of claim 1 further comprising:
   control means coupled to the edge detection circuitry for controlling when to operate the memory in a first mode wherein the memory performs a memory access every phase of the memory clock and when to operate the memory in a second mode wherein the memory performs a memory access every cycle of the memory clock.

7. The memory of claim 6 wherein the control means further comprises a control register for storing a control signal that is user programmable.

8. A method of accessing a memory comprising:
   providing an array of memory cells arranged in a plurality of rows and columns, said array having only one word line coupled to each memory cell in the array of memory cells;
   detecting a rising edge of a system clock for clocking said memory;
   in response to the rising edge, completing a first memory access operation prior to the system clock transitioning to another level;
   detecting a falling edge of the system clock; and
   in response to the falling edge, completing a second memory access operation prior to the system clock transitioning to another level, said memory performing two memory access operations in a single cycle of the system clock.

9. The method of claim 8 further comprising:
providing the memory as a single port memory.

10. The method of claim 9 further comprising:
each memory access to said memory comprises a plurality of functional steps that are self-timed by circuitry in relation to either the rising edge or the falling edge.

11. The method of claim 8 further comprising:
providing the memory as a dual port memory wherein each port of the dual port memory is capable of both read and write operations;
coupling row and column addressing and control circuitry to each end of a plurality of bit lines and to each end of a plurality of word lines in the array of memory cells; and
addressing selected ones of the plurality of bit lines from either end.

12. The method of claim 11 further comprising:
tri-stating the plurality of word lines to control each of the plurality of bit lines from either end.

13. The method of claim 11 further comprising:
independently accessing each port of the dual port memory for either a read access or a write access within a same clock cycle of the system clock.

14. The method of claim 8 further comprising:
providing the memory as a cache memory;
coupling a tag memory comprising memory cells and a comparator for providing a hit signal to the cache memory to indicate whether a received address corresponds to an address within the cache memory; and
using the rising edge and the falling edge of the system clock to control timing of the tag memory, said tag memory providing a first hit signal in response to the rising edge of the system clock and providing a second hit signal in response to the falling edge of the system clock, said tag memory providing two hit signals for two distinct cache memory accesses in a single cycle of the system clock.

15. A memory comprising:
a first read/write port;
a second read/write port;
an array of memory cells, each memory cell connected to a single word line having a first end and a second end to form a plurality of memory cells and a plurality of word lines;
a terminal for receiving a first system clock;
a terminal for receiving a second system clock; and
control circuitry coupled to the array of memory cells for starting and completing two separate memory accesses respectively via the first read/write port and the second read/write port in a single cycle of the first system clock.

16. The memory of claim 15 wherein the control circuitry further comprises:
row circuitry coupled to each end of the plurality of word lines for accessing each word line from either of two opposite ends.

17. The memory of claim 15 further comprising:
edge detection circuitry coupled to the first system clock and the second system clock, the edge detection circuitry enabling a first memory access which is completed during a first phase of the first system clock in response to detecting a rising edge of the first system clock, the edge detection circuitry enabling a second memory access which is completed during a second phase of the first system clock immediately following the first phase of the first system clock, the first system clock having a cycle comprising two phases.

18. The memory of claim 15, further comprising:
detection circuitry for detecting a beginning of a first phase of the first system clock and completing a first memory access via the first read/write port during the first phase of the first system clock, said detection circuitry detecting a beginning of an immediately successive second phase of the first system clock and completing a second memory access via the second read/write port during the second phase of the first system clock, the detection circuitry using the second system clock to determine when to latch an address for the second memory access.

19. The memory of claim 15 wherein the control circuitry further comprises:
first and second tri-state word line drivers respectively connected to opposite ends of each of the plurality of word lines, each of the first and second tri-state word line drivers coupled to separate address enable signals and having separate address inputs.

20. The memory of claim 15 wherein each memory access is self-timed to completion once a memory access is initiated.

* * * * *